United States Patent
Chou

(10) Patent No.: US 10,199,107 B2
(45) Date of Patent: Feb. 5, 2019

(54) DATA STORAGE DEVICE AND DATA REFRESH METHOD THEREOF

(71) Applicant: Silicon Motion, Inc., Jhubei (TW)

(72) Inventor: Po-Sheng Chou, Toufen (TW)

(73) Assignee: Silicon Motion, Inc., Jhubei (TW)

( * ) Notice: Subject to any disclaimer, the term of this patent is extended or adjusted under 35 U.S.C. 154(b) by 361 days.

(21) Appl. No.: 14/997,916

(22) Filed: Jan. 18, 2016

(65) Prior Publication Data

US 2016/0225460 A1 Aug. 4, 2016

(30) Foreign Application Priority Data

Feb. 4, 2015 (TW) .............................. 104103674 A

(51) Int. Cl.
| | | |
|---|---|---|
| G11C 16/26 | (2006.01) | |
| G11C 29/42 | (2006.01) | |
| G11C 16/34 | (2006.01) | |
| G11C 29/02 | (2006.01) | |
| G11C 29/04 | (2006.01) | |

(52) U.S. Cl.
CPC .......... G11C 16/26 (2013.01); G11C 16/3431 (2013.01); G11C 29/021 (2013.01); G11C 29/028 (2013.01); G11C 29/42 (2013.01); G11C 2029/0411 (2013.01)

(58) Field of Classification Search
CPC . G11C 16/3418; G11C 16/26; G11C 16/3431; G11C 29/021; G11C 29/42; G11C 16/3404
See application file for complete search history.

(56) References Cited

U.S. PATENT DOCUMENTS

| | | | | |
|---|---|---|---|---|
| 7,099,190 | B2 * | 8/2006 | Noguchi | G06F 11/1008 365/185.03 |
| 7,613,048 | B2 * | 11/2009 | Inoue | G11C 11/5628 365/185.09 |
| 8,713,399 | B1 * | 4/2014 | Tsatsaragkos | H03M 13/1111 714/752 |
| 8,929,140 | B2 * | 1/2015 | Nagashima | G06F 11/1048 365/185.11 |
| 2008/0243974 | A1 * | 10/2008 | Paumier | G06F 7/762 708/209 |
| 2012/0268994 | A1 * | 10/2012 | Nagashima | G06F 11/1048 365/185.11 |

(Continued)

FOREIGN PATENT DOCUMENTS

| | | |
|---|---|---|
| CN | 102483952 A | 5/2012 |
| CN | 103295635 A | 9/2013 |

(Continued)

OTHER PUBLICATIONS

Office Action of corresponding TW application, published on Apr. 26, 2016.

*Primary Examiner* — Phung M Chung
(74) *Attorney, Agent, or Firm* — Wang Law Firm, Inc.

(57) ABSTRACT

A data storage device includes a flash memory and a controller. The controller determines whether a first page of the flash memory meets a predetermined condition, and refreshes a block corresponding to the first page when the first page meets the predetermined condition, wherein the predetermined condition includes a voltage distribution of the first page being shifted to a predetermined direction, the predetermined direction being left.

16 Claims, 3 Drawing Sheets

(56) References Cited

U.S. PATENT DOCUMENTS

| | | | |
|---|---|---|---|
| 2014/0059396 A1 | 2/2014 | Matsuyama et al. | |
| 2015/0055411 A1* | 2/2015 | Kim | G11C 11/5628 365/185.02 |
| 2015/0138888 A1* | 5/2015 | Nagashima | G06F 11/1048 365/185.11 |
| 2015/0154114 A1* | 6/2015 | Han | G06F 12/0607 711/157 |

FOREIGN PATENT DOCUMENTS

| | | |
|---|---|---|
| CN | 104167220 A | 11/2014 |
| TW | 201403318 A | 1/2014 |

\* cited by examiner

DATA STORAGE DEVICE AND DATA REFRESH METHOD THEREOF

CROSS REFERENCE TO RELATED APPLICATIONS

This application claims priority of Taiwan Patent Application No. 104103674, filed on Feb. 4, 2015, the entirety of which is incorporated by reference herein.

BACKGROUND OF THE INVENTION

Field of the Invention

The present invention relates to a data refresh method of a data-storage device, and in particular to a data-storage device capable of refreshing data based on the shifted voltage distribution.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein the flash memory is constructed by floating gate transistors. The floating gates of the floating gate transistor may catch electronic charges for storing data. However, the floating gates may lose the electronic charges due to their operations, and the various environmental parameters of the flash memory, which can lead to data loss.

BRIEF SUMMARY OF THE INVENTION

A detailed description is given in the following embodiments with reference to the accompanying drawings.

The present invention provides a data storage device. The data storage device includes a flash memory and a controller. The controller determines whether a first page of the flash memory meets a predetermined condition, and refreshes a block corresponding to the first page when the first page meets the predetermined condition, wherein the predetermined condition comprises a voltage distribution of the first page being shifted to a predetermined direction, with the predetermined direction being left.

The present invention further provides a data refresh method including: determining whether a first page of a flash memory meets a predetermined condition; and refreshing a block corresponding to the first page when the first page meets the predetermined condition, wherein the predetermined condition comprises a voltage distribution of the first page being shifted to a predetermined direction, that predetermined direction being left.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
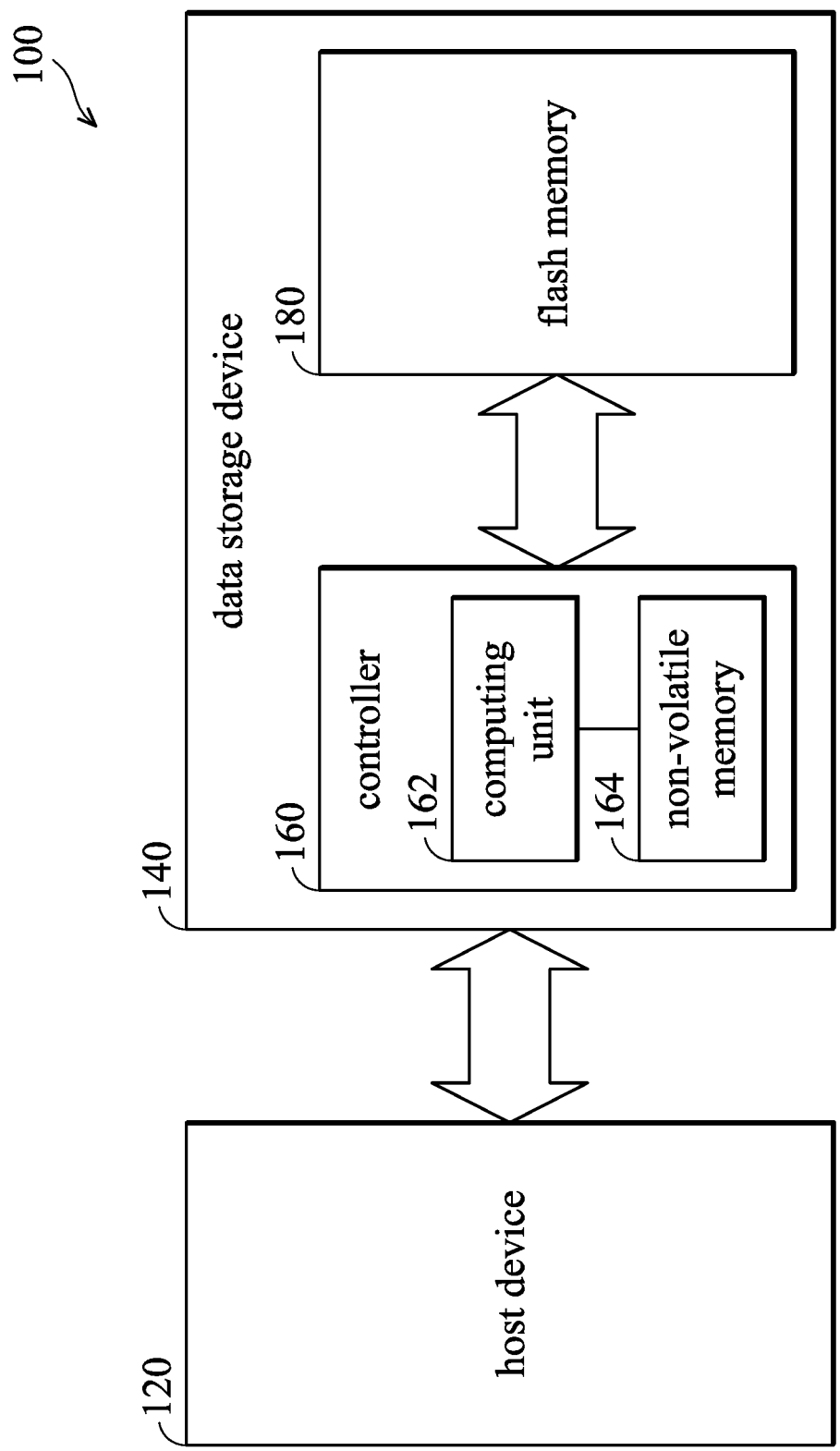
FIG. 1 is a schematic diagram illustrating an embodiment of an electronic system of the present invention.

FIG. 1 is a schematic diagram illustrating an embodiment of an electronic system of the present invention. The electronic system 100 includes a host device 120 and a data storage device 140. The data storage device 140 includes a flash memory 180 and a controller 160, and the data storage device 140 can operate in response to the commands of the host 110.

The controller 160 includes a computing unit 162, a non-volatile memory 164 (ROM), and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware, wherein the computing unit 162 further includes a first error-correction engine and/or a second error-correction engine. The first error-correction engine is arranged to perform an error correction on the retrieved data when the retrieved data cannot be successfully read. In one embodiment, the error correction performed by the first error-correction engine can be BCH error correction (Bose Chaudhuri Hocquenghem error correction), but it is not limited thereto. The second error-correction engine is arranged to perform another error correction on the retrieved data when the first error-correction engine cannot correct the retrieved data. In one embodiment, the second error-correction engine is arranged to use the low-density parity-check code (LDPC) to correct data, but it is not limited thereto. It should be noted that the first error-correction engine and the second error correction can be both implemented outside of the processing unit 162 or both implemented inside of the processing unit 162, but it is not limited thereto.

The flash memory 180 includes a plurality of blocks, and each of the blocks has a plurality of pages. In one embodiment, the minimum read unit of the flash memory 180 is a page and the minimum erase unit of the flash memory 180 is a block.

It should be noted that the LDPC error-correction engine can use different levels of the Gaussian distribution (such as nodes N2, N4, N6, N8, etc.) during the LDPC error correction to track the read voltage which can successfully read the data stored in the flash memory 180. The BCH error-correction engine can only use the read voltage provided by the reference cell or a read repeat table to correct data. The read voltage of the voltage distribution of the page will be shifted with changes of the environment due to the physical characteristics of flash memory 180, such as temperature and time. In some embodiments, the controller 160 can monitor the ability of data retention of the pages according to the number of times the page have been read and the number of error bits of the pages. However, it is easy to erase the pages or blocks without data retention problem by monitoring the ability of data retention according to the number of read repeat times and the number of error bits. Therefore, the present invention provides another method for monitoring the ability of data retention, wherein the controller 160 is arranged to determine whether the data retention is weak according to the direction that the voltage distribution has shifted.

Therefore, in one embodiment, the controller 160 is configured to determine whether the pages of the flash memory 180 meet a predetermined condition. When at least one page meets the predetermined condition, the controller 160 is configured to refresh the block corresponding to the page, wherein the predetermined condition includes the voltage distribution of the first page has shifted in a predetermined direction and the predetermined direction is left. It should be noted that the step of refreshing block includes writing the data to another block and erasing the original block. For example, the controller 160 is configured to perform a first read operation on the first page according to a read command of the host device 120. In one embodiment, the first read operation includes using the first error-correction engine to perform an error correction to correct at least one error bit of the first page. When the first read operation cannot successfully read the first page, the controller 160 is configured to determine whether the first page meets the predetermined condition. In the step of determining whether the first page meets the predetermined condition, the controller 160 is configured to use the LDPC error-correction engine (the second error-correction engine) to determine whether the voltage distribution of the first page has shifted in the predetermined direction. More specifically, the controller 160 is configured to determine that the voltage distribution of the first page has shifted in the predetermined direction when a correction read voltage with negative value is returned by one of the decoding stages which successfully corrects the error bits of the first page. For example, a correction read voltage which is a negative value can be F8, F16, F24, etc., wherein the "F" represent a negative value, and the numbers 8, 16 and 24 represent the degree of shifting, but it is not limited thereto. The other values which represent that the voltage distribution has shifted to the left or represents a negative value can be the correction read voltage with a negative value.

In another embodiment, the predetermined condition further includes the voltage distribution of the page has shifted over a predetermined value. For example, the controller 160 performs a first read operation on a first page according to a read command of a host device 120. In one embodiment, the first read operation includes using the first error-correction engine to perform an error correction to correct at least one error bit of the first page. When the first read operation cannot successfully read the data of the first page, the controller 160 is configured to determine whether the first page meets the predetermined condition. In the step of determining whether the first page meets the predetermined condition, the controller 160 can be configured to use the low-density parity-check code (the LDPC error-correction engine) to determine whether the voltage distribution of the first page has shifted in the predetermined direction over a predetermined value. More specifically, the low-density parity-check code includes a plurality of decoding stages, wherein the first decoding stage is node N4 of the Gaussian distribution, the second decoding stage is node N6 of the Gaussian distribution, the third decoding stage is node N8 of the Gaussian distribution, the fourth decoding stage is node N10 of the Gaussian distribution, and so on. Moreover, the first decoding stage is arranged to retrieve data from the first page three times with different read voltages three times, the second decoding stage is arranged to retrieve data from the first page five times with different read voltages, and the third decoding stage is arranged to retrieve data from the first page seven times with different read voltages, and so on. In one embodiment, the controller 160 is configured to use the low-density parity-check code which has a plurality of decoding stages to determine whether the voltage distribution of the first page has shifted over a predetermined value, wherein the controller 160 is configured to determine whether the voltage distribution of the first page has shifted over the predetermined value only when the number of decoding stages which successfully decodes the first page is greater than a predetermined number of decoding stages. In one embodiment, the predetermined number of decoding stages is three or greater. In other embodiments, the number of predetermined decoding stages can be first, second, fourth, or fifth, etc., but it is not limited thereto. Namely, when the stage number of decoding stages which can successfully correct the first page is greater than three, the controller 160 determines that the voltage distribution of the first page has shifted over the predetermined value. More specifically, the controller 160 is configured to perform a first decoding stage on the first page, and perform a second decoding stage on the first page when the first decoding stage cannot successfully decode the first page, perform a third decoding stage on the first page when the second decoding stage cannot successfully decode the first page, and read a correction read voltage obtained by the third decoding stage when the third decoding stage can successfully decode the first page. It should be noted that the controller 160 does not refresh the first page when the first decoding stage or the second decoding stage can successfully decode the first page. In this embodiment, the predetermined decoding stage is the third decoding stage. Therefore, the controller 160 determines that the voltage distribution of the first page has shifted over the predetermined value. Next, the controller 160 is further configured to determine whether the voltage distribution of the first page has shifted in the predetermined direction according to the correction read voltage. For example, a correction read voltage with the negative value can be F8, F16, F24, etc., wherein the "F" represents the negative value, and the numbers 8, 16 and 24 represent the level of voltage distribution shifting, but it is not limited thereto. The other values which represent that the voltage distribution has shifted to the left or represents a negative value can be the correction read voltage with a negative value. The operation of the decoding stages is described in detail below.

In the first decoding stage (N4), the controller 160 repeatedly re-reads the first page. The re-read step of the first decoding stage includes: re-reading the first page according to a predetermined read voltage for the first time, re-reading the first page according to a read voltage which is greater than the predetermined read voltage for a first predetermined value for the second time, and re-reading the first page according to a read voltage which is less than the predetermined read voltage the first predetermined value for the third time. In one embodiment, the first predetermined value can be 8, but it is not limited thereto. The first predetermined value can be designed based on different LDPC error correction. Moreover, the first decoding stage may obtain a first correction read voltage, wherein the first correction read voltage is one of the read voltages of the first decoding stage and is closest to the shifted voltage. Namely, the first correction read voltage is the closest one of the predetermined read voltage, the read voltage which is less than the predetermined read voltage for the first predetermined value and the read voltage which is greater than the predetermined read voltage for the first predetermined value. When the first correction read voltage still cannot successfully read the first page, the controller 160 preforms the second decoding stage.

In the second decoding stage (N6), the controller 160 repeatedly re-reads the first page. The re-read step of the second decoding stage includes: re-reading the first page according to the first correction read voltage for the first time, re-reading the first page according to a read voltage which is greater than the first correction read voltage for a first predetermined value for the second time, re-reading the first page according to a read voltage which is smaller than the first correction read voltage for the first predetermined value for the third time, re-reading the first page according to a read voltage which is greater than the first correction read voltage for a second predetermined value for the fourth time, and re-read the first page according to a read voltage which is less than the first correction read voltage for the second predetermined value for the fifth time. In one embodiment, the first predetermined value can be 8 and the second predetermined value can be 16, but it is not limited thereto. The second predetermined value is greater than the first predetermined value, and the first predetermined value and the second predetermined value can be designed based on different LDPC error correction. Moreover, the second decoding stage can obtain a second correction read voltage, wherein the second correction read voltage is one of the read voltages of the second decoding stage which is closest to the shifted voltage. Namely, the second correction read voltage is the closest one of the first correction read voltage, the read voltage which is less than the first correction read voltage for the first predetermined value, the read voltage which is greater than the first correction read voltage fir the first predetermined value, the read voltage which is less than the first correction read voltage for the second predetermined value, and the read voltage which is greater than the first correction read voltage for the second predetermined value. When the second correction read voltage cannot successfully read the first page, the controller 160 performs the third decoding stage.

In the third decoding stage (N8), the controller 160 repeatedly re-reads the first page. The step of re-read of the third decoding stage includes: re-read the first page according to the second correction read voltage at the first time, re-reading the first page according to a read voltage which is greater than the second correction read voltage for a first predetermined value at the second time, re-reading the first page according to a read voltage which is less than the second correction read voltage for the first predetermined value at the third time, re-reading the first page according to a read voltage which is greater than the second correction read voltage for a second predetermined value at the fourth time, re-reading the first page according to a read voltage which is less than the second correction read voltage for the second predetermined value at the fifth time, re-reading the first page according to a read voltage which is greater than the second correction read voltage for a third predetermined value at the sixth time, and re-reading the first page according to a read voltage which is less than the second correction read voltage for the third predetermined value at the seventh time. In this embodiment, the first predetermined value can be 8, the second predetermined value can be 16 and the third predetermined value can be 24, but it is not limited thereto. The third predetermined value is greater than the second predetermined value and the second predetermined value is greater than the first predetermined value. The first predetermined value, the second predetermined value and the third predetermined value can be designed based on the different LDPC error corrections. Moreover, the third decoding stage can obtain a third correction read voltage, wherein the third correction read voltage is one of the read voltages which is closest to the shifted voltage. Namely, the third correction read voltage is the closest one of the second correction read voltage, the read voltage which is less than the second correction read voltage for the first predetermined value, the read voltage which is greater than the second correction read voltage for the first predetermined value, the read voltage which is less than the second correction read voltage for the second predetermined value, the read voltage which is greater than the second correction read voltage for the second predetermined value, the read voltage which is less than the second correction read voltage for the third predetermined value, and the read voltage which is greater than the second correction read voltage for the third predetermined value. When the third correction read voltage cannot successfully read the first page, the fourth decoding stage will be preformed, and so on, until one of the decoding stages obtains a correction voltage which can successfully read the first page or the Nth decoding stage is performed. For example, the Nth decoding stage can be the third decoding stage, the fourth decoding stage, the fifth decoding stage or the sixth decoding stage, but it is not limited thereto. When the Nth decoding stage still cannot successfully correct the page, the controller 160 is configured to mark the page as a bad page or the block corresponding to the page as a bad block. When the decoding stage which successfully decodes the first page is after the predetermined decoding stage, the controller 160 determines that the voltage distribution of the first page has shifted over the predetermined value. Next, the controller 160 is further configured to determine whether the voltage distribution of the first page has shifted in the predetermined direction (left) according to the correction read voltage obtained by the decoding stage which successfully decodes the first page. For example, a correction read voltage which is a negative value can be F8, F16, F24, etc., wherein the "F" represent a negative value, and the numbers 8, 16 and 24 represent the degree of shifting, but it is not limited thereto. The other values which represent that the voltage distribution has shifted to the left or represents a negative value can be the correction read voltage with a negative value.

Figure 2:
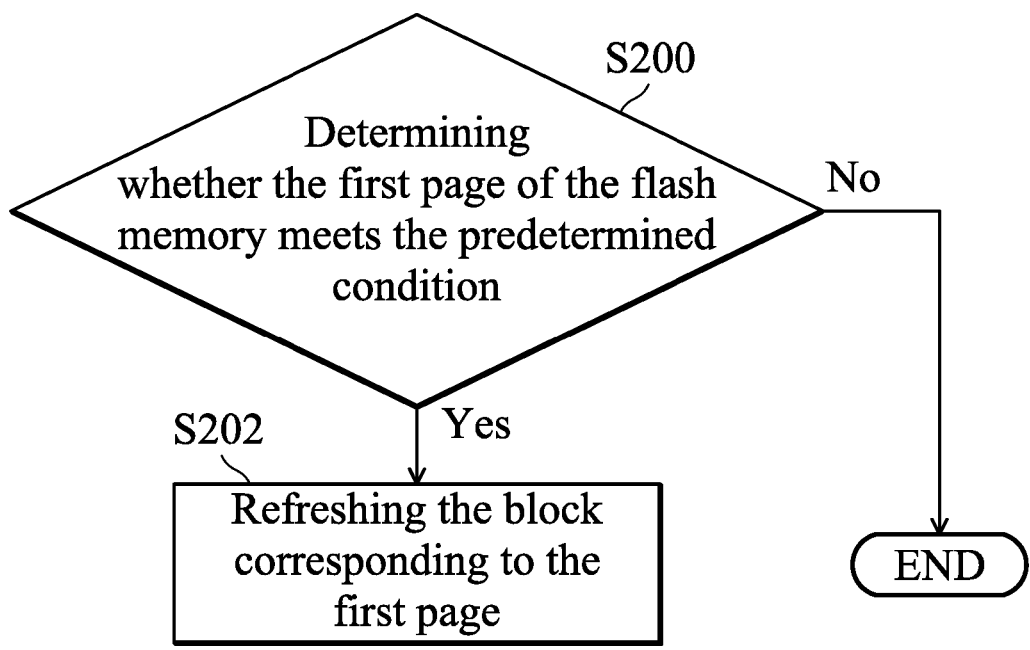
FIG. 2 is a flowchart of a data refresh method according to an embodiment of the present invention.

FIG. 2 is a flowchart of a data refresh method according to an embodiment of the present invention. The data refresh method is applied to the data storage device 140 of FIG. 1. In the embodiment of FIG. 2, the predetermined condition includes the voltage distribution of the page shifting in a predetermined direction. The process starts at step S200.

In step S200, the controller 160 is configured to determine whether the first page of the flash memory 180 meets the predetermined condition. Namely, the controller 160 is configured to determine whether the voltage distribution of the first page has shifted in a predetermined direction. In one embodiment, the predetermined direction is left. When the first page meets the predetermined condition, the process goes to step S202, otherwise, the process ends at step S200. In one embodiment, the controller 160 uses the low-density parity-check code (LDPC) error correction to determine whether the voltage distribution of the first page has shifted in the predetermined direction. Namely, the low-density parity-check code includes a plurality of decoding stages. When one of the decoding stages successfully corrects the data of the first page and returns a correction read voltage with the negative value, the controller 160 determines that the voltage distribution of the first page has shifted in the predetermined direction.

In step S202, the controller 160 is configured to refresh the block corresponding to the first page. Namely, the controller 160 is configured to refresh the block that includes the first page. More specifically, the controller 160 is configured to write the data of the original block corresponding to another block, and erase the original block. The process ends at step S202.

Figure 3:
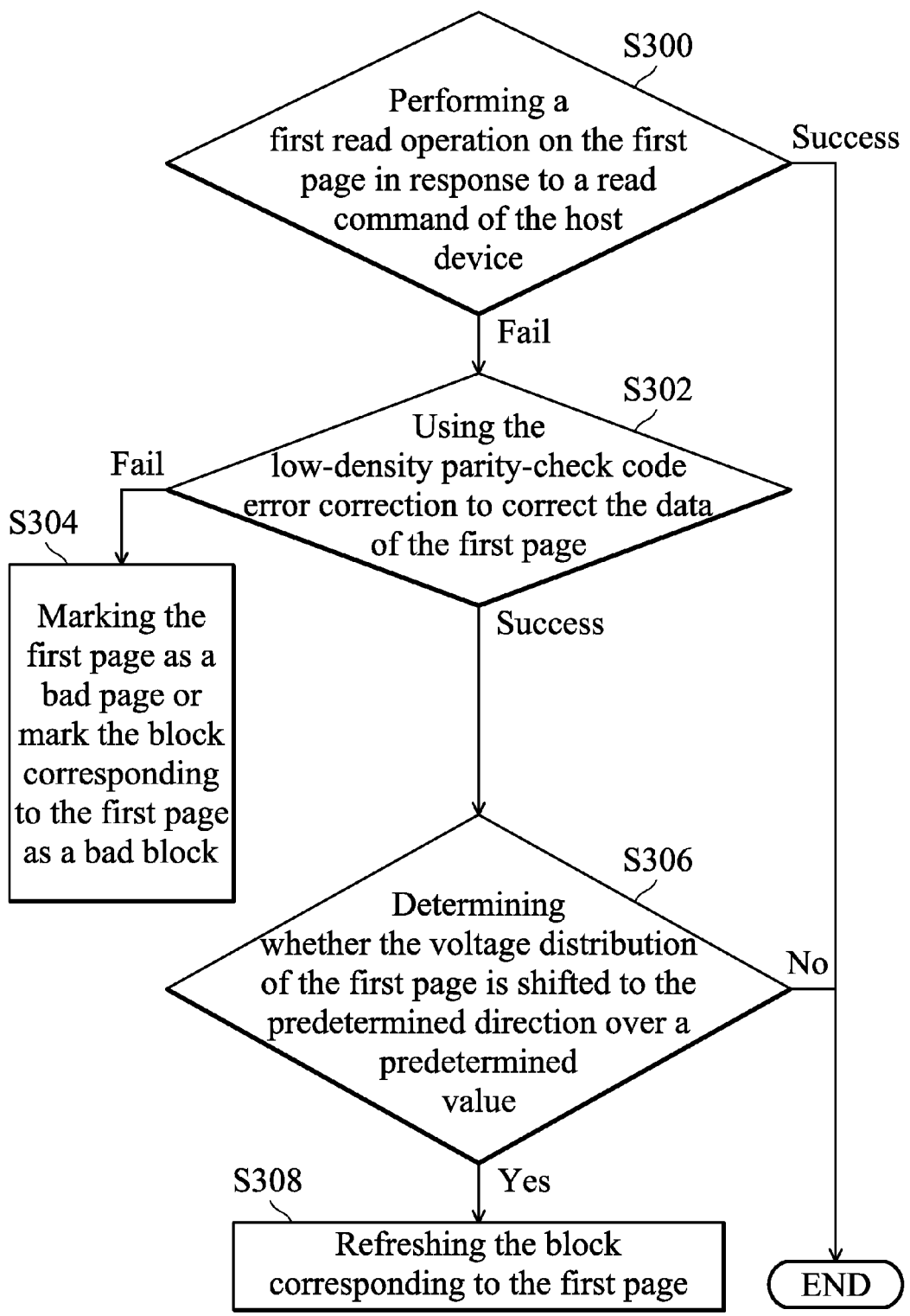
FIG. 3 is a flowchart of a data refresh method according to another embodiment of the present invention.

FIG. 3 is a flowchart of a data refresh method according to another embodiment of the present invention. The data refresh method is applied to the data storage device 140 of FIG. 1. In the embodiment of FIG. 3, the predetermined condition includes the voltage distribution of the page shifting in a predetermined direction over a predetermined value. The process starts at step S300.

In step S300, the controller 160 is configured to perform a first read operation on the first page in response to a read command of the host device 120. When the first read operation cannot successfully read the first page, the process goes to step S302 to determine whether the first page meets the predetermined condition by step S302 and step S306. When the first read operation can successfully read the first page, the process ends at step S300. In one embodiment, the first read operation includes using an error correction in the first read operation to correct at least one error bit of the data retrieved from the first page. For example, the error correction can be performed by the first error-correction engine (BCH error-correction engine), but it is not limited thereto.

Next, in step S302, the controller 160 uses the low-density parity-check code (LDPC) error correction to correct the data of the first page. It should be noted that the LDPC error-correction engine can use different levels of the Gaussian distribution (such as nodes N2, N4, N6, N8, etc.) during the LDPC error correction to track the read voltage which can successfully read the data stored in the flash memory 180. More specifically, the low-density parity-check code includes a plurality of decoding stages, wherein the first decoding stage is node N4 of the Gaussian distribution, the second decoding stage is node N6 of the Gaussian distribution, the third decoding stage is node N8 of the Gaussian distribution, the fourth decoding stage is node N10 of the Gaussian distribution, and so on. Moreover, the first decoding stage is arranged to retrieve data from the first page three times with different read voltages three times, the second decoding stage is arranged to retrieve data from the first page five times with different read voltages, and the third decoding stage is arranged to retrieve data from the first page seven times with different read voltages, and so on. When the low-density parity-check code can successfully correct the data of the first page, the process goes to step S306. When the low-density parity-check code cannot correct the data of the first page, the process goes to step S304.

In step S304, the controller 160 is configured to mark the first page as a bad page or mark the block corresponding to the first page as a bad block. The process ends at step S304.

In step S306, the controller 160 is configured to determine whether the voltage distribution of the first page has shifted in the predetermined direction over a predetermined value. More specifically, the low-density parity-check code includes a plurality of decoding stages, wherein the first decoding stage is node N4 of the Gaussian distribution, the second decoding stage is node N6 of the Gaussian distribution, the third decoding stage is node N8 of the Gaussian distribution, the fourth decoding stage is node N10 of the Gaussian distribution, and so on. Moreover, the first decoding stage is arranged to retrieve data from the first page three times with different read voltages three times, the second decoding stage is arranged to retrieve data from the first page five times with different read voltages, and the third decoding stage is arranged to retrieve data from the first page seven times with different read voltages, and so on. In one embodiment, the predetermined decoding stage is the third decoding stage. In other embodiments, the predetermined decoding stage can be the first decoding stage, the second decoding stage, the fourth decoding stage, the fifth decoding stage, etc., but it is not limited thereto. Namely, when the first page is successfully corrected by a decoding stage which is after the third decoding stage, the controller 160 determines that the voltage distribution of the first page has shifted over the predetermined value. More specifically, the controller 160 is configured to perform a first decoding stage on the first page, and perform a second decoding stage on the first page when the first decoding stage cannot successfully decode the first page, perform a third decoding stage on the first page when the second decoding stage cannot successfully decode the first page, and read a correction read voltage obtained by the third decoding stage when the third decoding stage can successfully decode the first page. In this embodiment, the predetermined decoding stage is the third decoding stage. Therefore, the controller 160 determines that the voltage distribution of the first page has shifted over the predetermined value. Next, the controller 160 is configured to determine whether the voltage distribution of the first page has shifted in the predetermined direction (left) according to the value of the correction read voltage. For example, a correction read voltage which is a negative value can be F8, F16, F24, etc., wherein the "F" represents a negative value, and the numbers 8, 16 and 24 represent the degree of shifting, but it is not limited thereto. The other values which represent that the voltage distribution has shifted to the left or represents a negative value can be the correction read voltage with a negative value. When the voltage distribution of the first page has shifted in the predetermined direction over the predetermined value, the process goes to step S308, otherwise, the process ends at step S306.

In step S308, the controller 160 is configured to refresh the block corresponding to the first page. Namely, the controller 160 is configured to refresh the block that includes the first page. More specifically, the controller 160 is configured to write the data of the original block corresponding to another block, and erase the original block. The process ends at step S308.

The data storage device 140 of the present invention can determine whether the voltage distribution of page has shifted in a predetermined direction for monitoring the ability of data retention.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory; and
a controller, determining whether a first page of the flash memory meets a predetermined condition, and refreshing a block corresponding to the first page when the first page meets the predetermined condition, wherein the predetermined condition comprises a voltage distribution of the first page being shifted to a predetermined direction, with the predetermined direction being left;
wherein the controller uses a low-density parity-check code to correct error bits of the first page and determine whether the voltage distribution of the first page has shifted to the predetermined direction;
wherein the low-density parity-check code comprises a plurality of decoding stages, and the controller determines that the voltage distribution of the first page has shifted to the left when one of the decoding stages successfully corrects the error bits of the first page and correspondingly returns a correction read voltage with negative value.

2. The data storage device as claimed in claim 1, wherein the predetermined condition further comprises the voltage distribution of the first page being shifted over a predetermined value.

3. The data storage device as claimed in claim 2, wherein the controller uses the plurality of decoding stages of the low-density parity-check code to determine whether the voltage distribution of the first page has shifted over a predetermined value, wherein the controller determines that the voltage distribution of the first page has shifted over the predetermined value when the number of decoding stages which can successfully decode the first page is greater than a predetermined number.

4. The data storage device as claimed in claim 3, wherein the predetermined number of decoding stages is three.

5. The data storage device as claimed in claim 2, wherein the controller performs a first decoding stage on the first page, performs a second decoding stage on the first page when the first decoding stage cannot successfully decode the first page, performs a third decoding stage on the first page when the second decoding stage cannot successfully decode the first page, and determines that the voltage distribution of the first page has shifted over the predetermined value and has shifted in the predetermined direction when the third decoding stage successfully decodes the first page and returns a correction read voltage with negative value.

6. The data storage device as claimed in claim 5, wherein the first decoding stage is arranged to re-read the first page three times, the second decoding stage is arranged to re-read the first page five times, and the third decoding stage is arranged to re-read the first page seven times.

7. The data storage device as claimed in claim 1, wherein the controller performs a first read operation on the first page in response to a read command of a host device, and the step of determining whether the first page meets the predetermined condition is performed only when the first read operation cannot successfully read the first page.

8. The data storage device as claimed in claim 7, wherein the first read operation comprises an error correction arranged to correct at least one error bit of the first page retrieved by the first read operation.

9. A data refresh method, comprising:
determining whether a first page of a flash memory meets a predetermined condition; and
refreshing a block corresponding to the first page when the first page meets the predetermined condition, wherein the predetermined condition comprises a voltage distribution of the first page being shifted to a predetermined direction, wherein the predetermined direction is left;
wherein the step of determining whether the first page of the flash memory meets the predetermined condition further comprises using a low-density parity-check code to correct error bits of the first page and to determine whether the voltage distribution of the first page has shifted to the predetermined direction;
wherein the low-density parity-check code comprises a plurality of decoding stages, and the step of determining whether the first page of the flash memory meets the predetermined condition further comprises determining that the voltage distribution of the first page has shifted to the left when one of the decoding stages successfully corrects the error bits of the first page and correspondingly returns a correction read voltage with negative value to the controller.

10. The data refresh method as claimed in claim 9, wherein the predetermined condition further comprises the voltage distribution of the first page being shifted over a predetermined value.

11. The data refresh method as claimed in claim 10, wherein the step of determining whether the first page of the flash memory meets the predetermined condition further comprises using the plurality of decoding stages of the low-density parity-check code to determine whether the voltage distribution of the first page has shifted over a predetermined value, and determining that the voltage distribution of the first page has shifted over the predetermined value when the number of decoding stages which can successfully decode the first page is greater than a predetermined number.

12. The data refresh method as claimed in claim 11, wherein the predetermined number of decoding stages is three.

13. The data refresh method as claimed in claim 10, wherein the step of determining whether the first page of the flash memory meets the predetermined condition further comprises:
performing a first decoding stage on the first page;
performing a second decoding stage on the first page when the first decoding stage cannot successfully decode the first page;
performing a third decoding stage on the first page when the second decoding stage cannot successfully decode the first page; and
determining that the voltage distribution of the first page has shifted over the predetermined value and has shifted in the predetermined direction when the third decoding stage successfully decodes the first page and returns a correction read voltage with negative value.

14. The data refresh method as claimed in claim 13, wherein the first decoding stage is arranged to re-read the first page three times, the second decoding stage is arranged to re-read the first page five times, and the third decoding stage is arranged to re-read the first page seven times.

15. The data refresh method as claimed in claim 9, further comprising performing a first read operation on the first page in response to a read command of a host device, and the step of determining whether the first page meets the predetermined condition is performed only when the first read operation cannot successfully read the first page.

16. The data refresh method as claimed in claim 15, wherein the first read operation comprises an error correction arranged to correct at least one error bit of the first page retrieved by the first read operation.

\* \* \* \* \*